(12) United States Patent
Cudak et al.

(10) Patent No.: US 10,209,749 B2
(45) Date of Patent: Feb. 19, 2019

(54) WORKLOAD ALLOCATION BASED ON DOWNSTREAM THERMAL IMPACTS

(71) Applicant: LENOVO Enterprise Solutions (Singapore) PTE. LTD., New Tech Park (SG)

(72) Inventors: Gary D. Cudak, Wake Forest, NC (US); Shareef F. Alshinnawi, Apex, NC (US); Jeffrey S. Holland, Newton, NC (US); Pradeep Ramineni, Cary, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 547 days.

(21) Appl. No.: 14/740,157

(22) Filed: Jun. 15, 2015

(65) Prior Publication Data
US 2016/0363973 A1  Dec. 15, 2016

(51) Int. Cl.
G06F 15/16 (2006.01)
G06F 1/20 (2006.01)
H01L 25/00 (2006.01)

(52) U.S. Cl.
CPC .............. G06F 1/206 (2013.01); H01L 25/00 (2013.01); Y02D 10/16 (2018.01)

(58) Field of Classification Search
None
See application file for complete search history.

(56) References Cited

U.S. PATENT DOCUMENTS

| | | | | |
|---|---|---|---|---|
| 8,397,088 | B1* | 3/2013 | Ghose | G06F 1/3206 713/300 |
| 8,880,225 | B2* | 11/2014 | Iyengar | G05D 23/1932 700/276 |
| 2004/0128663 | A1* | 7/2004 | Rotem | G06F 1/206 717/161 |
| 2007/0089446 | A1* | 4/2007 | Larson | G05D 23/1931 62/259.2 |
| 2008/0052483 | A1* | 2/2008 | Rangarajan | G06F 1/206 711/170 |
| 2009/0099705 | A1* | 4/2009 | Harris | G06F 1/206 700/300 |
| 2012/0158206 | A1* | 6/2012 | Longobardi | G05B 13/048 700/300 |

(Continued)

Primary Examiner — Umar Cheema
Assistant Examiner — Gregory P Tolchinsky
(74) Attorney, Agent, or Firm — Kunzler, PC

(57) ABSTRACT

An apparatus for workload management includes a thermal relationship module, a thermal effect module, and a resource allocation module. The thermal relationship module determines a plurality of thermal relationships among components of an electronic device. Each thermal relationship quantifies a thermal impact on one of the components of utilizing another of the components. The thermal effect module determines one or more potential thermal effects of a workload on the components based on the thermal relationships. The one or more potential thermal effects correspond to one or more possible allocations of resources of at least a portion of the components to run the workload. The resource allocation module selects an allocation of resources from the one or more possible allocations of resources to run the workload, based on the determined potential thermal effects.

17 Claims, 5 Drawing Sheets

(56) References Cited

U.S. PATENT DOCUMENTS

| | | | |
|---|---|---|---|
| 2012/0173037 A1* | 7/2012 | Therien | G06F 1/206 700/300 |
| 2013/0067136 A1* | 3/2013 | Bates | G06F 12/00 711/103 |
| 2016/0011607 A1* | 1/2016 | James | G05B 15/02 700/300 |

\* cited by examiner

WORKLOAD ALLOCATION BASED ON DOWNSTREAM THERMAL IMPACTS

BACKGROUND

Field

The subject matter disclosed herein relates to electronic devices and more particularly relates to allocating electronic device resources to workloads based on thermal effects.

Description of the Related Art

Electronic devices such as servers and other computers often run multiple jobs at the same time, using various components to provide resources such as processing, memory, storage, input/output, and the like. Resource allocation for workloads is often based on availability and scheduling priority. The components of an electronic device experience increased temperatures with higher utilization. Overheating a component may decrease the life of the component, increase power consumption and cooling requirements, and increase service or warranty costs. For example, service costs for certain hard drives may increase by approximately one dollar per year, for every degree increase above a temperature threshold.

BRIEF SUMMARY

An apparatus for workload management is disclosed. A method and program product also perform the functions of the apparatus. The apparatus includes a thermal relationship module, a thermal effect module, and a resource allocation module. The thermal relationship module determines a plurality of thermal relationships among components of an electronic device. Each thermal relationship quantifies a thermal impact on one of the components of utilizing another of the components. The thermal effect module determines one or more potential thermal effects of a workload on the components based on the thermal relationships. The one or more potential thermal effects correspond to one or more possible allocations of resources of at least a portion of the components to run the workload. The resource allocation module selects an allocation of resources from the one or more possible allocations of resources to run the workload, based on the determined potential thermal effects.

In one embodiment, the apparatus includes a thermal state module that determines a thermal state of the electronic device using one or more temperature sensors. In a certain embodiment, the thermal state includes at least one temperature for at least one of the component. In a further embodiment, the resource allocation module selects the allocation of resources based on the thermal state and the determined potential thermal effects.

In one embodiment, the apparatus includes the electronic device, including the components and the one or more temperature sensors. In a certain embodiment, the components include one or more processors, one or more memory modules, and/or one or more storage devices.

In one embodiment, the plurality of thermal relationships includes a network of thermal relationships between multiple components of the electronic device. In a further embodiment, at least one of the components links two or more of the thermal relationships. In a certain embodiment, determining a potential thermal effect includes determining a primary thermal effect on a first set of components based on the workload utilizing the first set of components, and determining a secondary thermal effect on a second set of components, based on heating of the second set of components by the first set of components.

In one embodiment, selecting an allocation of resources includes reallocating resources while the workload is running, to avoid exceeding a thermal limit. In another embodiment, selecting an allocation of resources includes allocating resources for the workload before the workload runs, to distribute a thermal load among the components.

In one embodiment, determining the thermal relationships includes computing a thermal relationship based on a topology for the electronic device. In another embodiment, determining the thermal relationships includes utilizing one component and measuring the thermal impact on another component, using one or more temperature sensors. In a certain embodiment, determining the thermal relationships includes receiving a thermal relationship from an administrator for the electronic device, a storage location for specifications of the electronic device, and/or a management entity for a plurality of electronic devices including the electronic device.

In one embodiment, determining the one or more potential thermal effects includes predictively modeling a potential thermal effect over time. In a further embodiment, selecting an allocation of resources includes allocating resources, based on the potential thermal effect over time, to avoid exceeding a thermal limit. In a certain embodiment, selecting an allocation of resources includes using a workload manager to allocate resources on a component by component basis.

A method for workload management includes determining a plurality of thermal relationships among components of an electronic device. Each thermal relationship quantifies a thermal impact on one of the components of utilizing another of the components. The method includes determining one or more potential thermal effects of a workload on the components based on the thermal relationships. The one or more potential thermal effects correspond to one or more possible allocations of resources of at least a portion of the components to run the workload. The method includes selecting an allocation of resources from the one or more possible allocations of resources to run the workload, based on the determined potential thermal effects.

In one embodiment, selecting an allocation of resources includes reallocating resources while the workload is running, to avoid exceeding a thermal limit. In another embodiment, selecting an allocation of resources includes allocating resources for the workload before the workload runs, to distribute a thermal load among the components.

In one embodiment, determining the thermal relationships includes utilizing one component and measuring the thermal impact on another component. In another embodiment, determining the thermal relationships includes receiving a thermal relationship from an administrator for the electronic device, a storage location for specifications of the electronic device, and/or a management entity for a plurality of electronic devices including the electronic device. In a certain embodiment, determining the one or more potential thermal effects includes predictively modeling a potential thermal effect over time. In a further embodiment, selecting an allocation of resources includes allocating resources, based on the potential thermal effect over time, to avoid exceeding a thermal limit.

A program product for workload management includes a computer readable storage medium that stores code executable by a processor. The executable code includes code that determines a plurality of thermal relationships among components of an electronic device. Each thermal relationship quantifies a thermal impact on one of the components of utilizing another of the components. The executable code includes code that determines one or more potential thermal effects of a workload on the components based on the thermal relationships. The one or more potential thermal effects correspond to one or more possible allocations of resources of at least a portion of the components to run the workload. The executable code includes code that selects an allocation of resources from the one or more possible allocations of resources to run the workload, based on the determined potential thermal effects.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
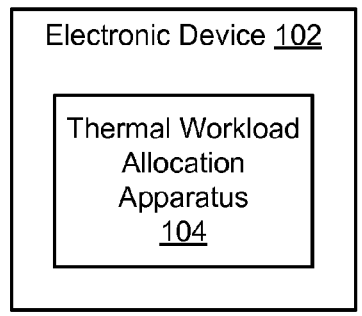
FIG. 1A is a schematic block diagram illustrating one embodiment of a system for workload management.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/ acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1A depicts one embodiment of a system 100 for workload management. The system 100 includes an electronic device 102 and a thermal workload allocation apparatus 104, which are described below.

In the depicted embodiment, the system 100 includes a thermal workload allocation apparatus 104 on the electronic device 102. In another embodiment, the thermal workload allocation apparatus 104 may be separate from the electronic device 102 but in communication with, the electronic device 102. In general, the thermal workload allocation apparatus 104 determines thermal relationships among components of the electronic device 102, determines potential thermal effects of various allocations of the components' resources to run a workload, and selects an allocation of resources to run the workload based on the potential thermal effects. In certain embodiments, allocating resources to run a workload based on thermal effects allows a thermal workload allocation apparatus 104 to avoid overheating that might otherwise occur, even within individual workload tolerances for the components, due to one component pre-heating another component. The thermal workload allocation apparatus 104 is described in more detail with respect to the apparatus 200 of FIG. 2.

The electronic device 102 may be a mainframe computer, a rack-mounted server, a blade server, a workstation, a desktop computer, a server cluster, a telecommunications device, a data storage device, a special-purpose computing appliance, any other computer, or any other electronic device in which one component thermally affects another component when the electronic device 102 runs a workload. In one embodiment, the electronic device 102 may be a stand-alone device. For example, the electronic device 102 may be a single server. In another embodiment, the electronic device 102 may be a collection or cluster of individual devices, such as server rack, a server farm, a data center, or the like. In general, the electronic device 102 includes components such that utilizing one component has a thermal impact on another thermal component. The utilized component may be referred to as thermally "upstream" from the thermally impacted component, and the thermally impacted component may be referred to as thermally "downstream" from the utilized component. Components that thermally impact or affect each other may also be said to be thermally "adjacent", "in thermal proximity," or "in a thermal relationship." Since many electronic devices 102 include multiple components that might thermally affect other components, a network of linked thermal relationships may exist for certain electronic devices 102. Components of an electronic device 102 are described in more detail with respect to the system 150 of FIG. 1B.

Figure 1B:
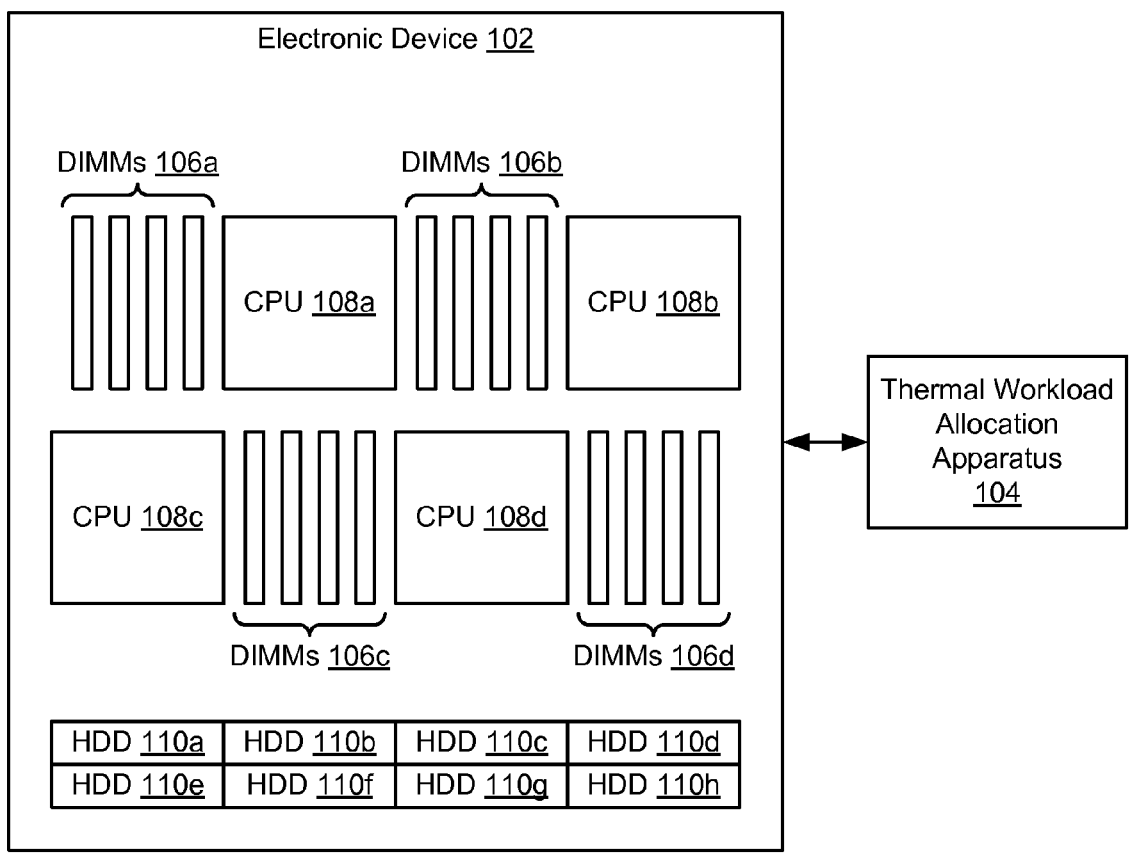
FIG. 1B is a schematic block diagram illustrating another embodiment of a system for workload management.

FIG. 1B is a schematic block diagram illustrating another embodiment of a system 150 for workload management. The system 150 includes an electronic device 102 and a thermal workload allocation apparatus 104, which are substantially similar to those described above in relation to the system 100 of FIG. 1A. In the depicted embodiment, the electronic device 102 includes components such as dual in-line memory modules ("DIMMs") 106a-d, processors or central processing units ("CPUs") 108a-d, and hard disk drives ("HDDs") 110a-h. The depicted components 106, 108, 110 are for illustrative and not limiting purposes; in another embodiment, an electronic device 102 may include alternative and/or additional components.

In the depicted embodiment, the thermal workload allocation apparatus 104 is separate from the electronic device 102, but in communication with the electronic device 102. For example, the electronic device 102 may be a first server, and the thermal workload allocation apparatus 104 may operate on another server or computer in communication with the first server via a local area network ("LAN"), a wide area network ("WAN"), a wireless network, a server management port, or the like. In another embodiment, however, the thermal workload allocation apparatus 104 may operate on the electronic device 102. For example, the electronic device 102 may be a server and the thermal workload allocation apparatus 104 may run on, or be integrated with an operating system for the server, may run on a dedicated internal service processor for the server, may be integrated with server firmware, or the like. One of skill in the art will recognize other ways of operating a thermal workload allocation apparatus 104, on the electronic device 102 or on another device.

In the depicted embodiment, the electronic device 102 is a rack-mounted server, with components including DIMMs 106a-d, CPUs 108a-d, and HDDs 110a-h. In the depicted embodiment, the DIMMs 106a-d are components that provide memory resources for the electronic device 102. In various embodiments, DIMMs 106a-d may have various form factors, or include various types of memory. In another embodiment, memory components for an electronic device 102 may be in another modular form, or a non-modular form. For example, in one embodiment, memory integrated circuits may be soldered directly to a motherboard for the electronic device 102. In another embodiment, an electronic device 102 may include more or fewer DIMMs 106a-d than are shown in FIG. 1B. One of skill in the art will recognize many possible configurations of memory components for an electronic device 102.

In the depicted embodiment, the CPUs 108a-d are components that provide processing resources for the electronic device 102. As shown in FIG. 1B, the electronic device 102 includes four CPUs 108a-d. In another embodiment, the electronic device 102 may include another number of CPUs 108a-d. In various embodiments, a CPU 108a-d may include a general-purpose processor, a single-core processor, a multiple-core processor, a microcontroller, a system on a chip, or the like. In another embodiment, an electronic device 102 may include other components that provide processing resources in addition to, or in place of, the CPUs 108a-d, such as an application-specific integrated circuit ("ASIC"), a field-programmable gate array ("FPGA"), a graphics processing unit ("GPU"), or the like. One of skill in the art will recognize many possible configurations of processing components for an electronic device 102.

In the depicted embodiment, the HDDs 110a-h are components that provide storage resources for the electronic device 102. As shown in FIG. 1B, the electronic device 102 includes eight HDDs 110a-h. In another embodiment, the electronic device 102 may include another number of HDDs 110a-h. In various embodiments, an electronic device 102 may include other components that provide storage resources in addition to, or in place of, the HDDs 110a-h. For example, in one embodiment, an electronic device 102 may include one or more solid state drives, optical drives, or other types of storage devices. One of skill in the art will recognize many possible configurations of storage components for an electronic device 102.

In certain embodiments, an electronic device 102 may include various components in addition to, or in place of the components depicted in FIG. 1B (including DIMMs 106a-d, CPUs 108a-d, and HDDs, 110a-h). For example, in various embodiments, an electronic device 102 may include one or more power supplies, expansion cards, graphics processors, input/output components (e.g., a network interface controller), redundant array of independent disks ("RAID") controllers, memory controllers, input/output controllers, or the like. One of skill in the art will recognize many types of components that an electronic device 102 may include.

In various embodiments, utilizing one component of an electronic device 102 (such as one of the DIMMs 106a-d, CPUs 108a-d, or HDDs, 110a-h) may thermally affect or impact another component. For example, in the depicted embodiment, the electronic device 102 is a rack-mounted server with HDDs 110a-h in the front of the server, and airflow for cooling the server being driven in the front and out the back (past DIMMs 106a-d and CPUs 108a-d). Thus, for example, utilizing CPU 108c may cause heating of nearby components, such as HDDs 110a, 110e, and DIMMs 106a, 106c. DIMMs 106a may be particularly heated by utilizing CPU 108c, due to pre-heating of the air passing over CPU 108c. Similarly, the left-most of DIMMs 106c may be particularly heated by utilizing CPU 108c, due to that DIMM's greater proximity to the utilized CPU 108c. Utilizing one component may also cause heating of less nearby components. For example, utilizing CPU 108c may have some effect on CPU 108d, and an even lesser effect on CPU 108b, which is furthest away from CPU 108c. Although CPU utilization is discussed as an example, utilizing any component may have a thermal effect on another component. In various embodiments, the thermal workload allocation apparatus 104 may allow the electronic device 102 to run workloads in a way that accounts for the thermal effects of components on other components, as described below.

Figure 2:
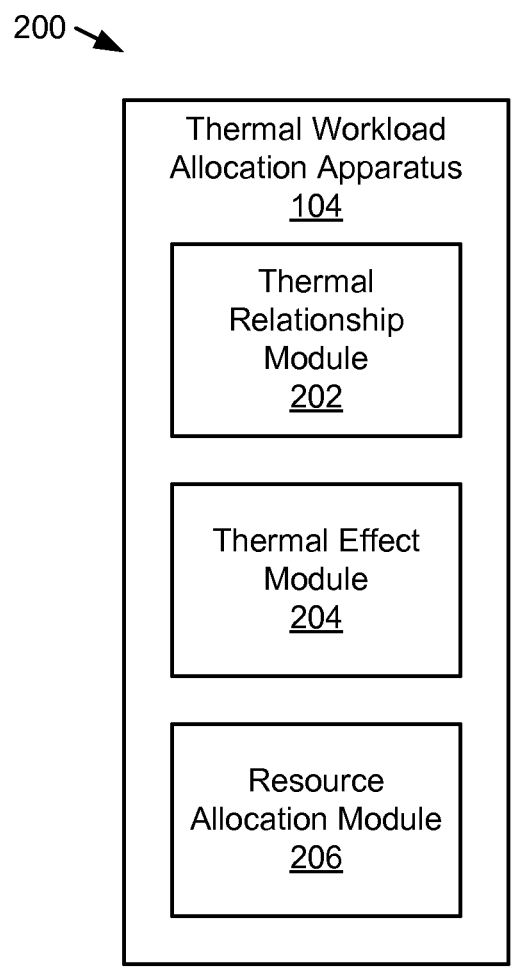
FIG. 2 is a schematic block diagram illustrating one embodiment of an apparatus for workload management.

FIG. 2 is a schematic block diagram illustrating one embodiment of an apparatus 200 for workload management. In one embodiment, the apparatus 200 includes a thermal workload allocation apparatus 104 with a thermal relationship module 202, a thermal effect module 204, and a resource allocation module 206, which are described below. In general, the apparatus 200 determines thermal effects of workloads on components of an electronic device, and selects an allocation of resources (from the components) to run a workload, based on the determined thermal effects. In certain further embodiments, the apparatus 200 may include the electronic device, including the components and/or one or more temperature sensors.

The apparatus 200, in one embodiment, includes a thermal relationship module 202 that determines a plurality of thermal relationships among components of an electronic device. The electronic device and components may be substantially similar to the electronic device 102 and components 106, 108, 110 described above with regard to FIGS. 1A and 1B. For example, in one embodiment, the components may include one or more processors (e.g., CPUs 108a-d), one or more memory modules (e.g., DIMMs 106a-d), one or more storage devices (e.g. HDDs 110a-h), and the like.

In one embodiment, each thermal relationship determined by the thermal relationship module 202 quantifies a thermal impact on one of the components of utilizing another of the components. In various embodiments, a "component" may refer to any component, at any granularity, that is in a thermal relationship quantified by the thermal relationship module 202. For example, in different embodiments, a memory component with a thermal relationship quantified by the thermal relationship module 202 may be a DIMM, a bank of DIMMs located together, or a single memory integrated circuit on a DIMM. Similarly, a processor component with a thermal relationship quantified by the thermal relationship module 202 may be a CPU, or a particular CPU core.

In certain embodiments, a thermal impact may refer to any thermal effect caused, for one component, by using another component. In various embodiments, a thermal relationship may quantify a thermal impact, on one component, of using another component, in various ways, and at various levels of granularity. For example, in one embodiment, a thermal relationship may quantify a thermal impact between two components using a single bit of information indicating whether a first component is more likely or less likely to be significantly thermally affected by using a second component. In another embodiment, a thermal relationship may quantify a thermal impact between two components at a higher level of granularity by recording an amount of pre-heating (e.g., in degrees) that is expected for the first component when the second component is utilized at various power levels, or for varying amounts of time. One of skill in the art will recognize various ways of quantifying thermal relationships between components. Various ways of determining thermal relationships are described further below, with respect to the apparatus 300 of FIG. 3.

In one embodiment, a plurality of thermal relationships may include a network of thermal relationships between multiple components of an electronic device. For example, a plurality of thermal relationships between hypothetical components A, B, and C may quantify the thermal impact on components B and C of using component A, the thermal impact on components A and C of using component B, and the thermal impact on components A and B of using component C.

In a further embodiment, at least one of the components may link two or more of the thermal relationships. A component may "link" two thermal relationships if it is common to both of the thermal relationships, either as a utilized component, an affected component, or as a utilized component in one thermal relationship and an affected component in another thermal relationship.

The apparatus 200, in one embodiment, includes a thermal effect module 204 that determines one or more potential thermal effects of a workload on the components based on the thermal relationships determined by the thermal relationship module 202. In a further embodiment, the one or more potential thermal effects determined by the thermal effect module 204 correspond to one or more possible allocations of resources of at least a portion of the components to run the workload.

In various embodiments, a "workload" may refer to any task, set of tasks, instruction, sequences of instructions, or the like, that may be performed, or "run" by the electronic device. Many workloads do not require 100% of the resources of the electronic device, so in certain embodiments, resources provided by the components (or a portion of the components) may be allocated in many different ways to run a workload (or to run multiple workloads). For example, a workload that uses a certain amount of memory may be allocated that memory on one particular DIMM, on another DIMM, or spread across multiple DIMMS. Similarly, a workload that uses a certain amount of processor power may be allocated processor power from one CPU, another CPU, or from multiple CPUs. Thus, for any workload, one or more possible allocations of resources may exist for running the workload.

In certain embodiments, different possible allocations of resources for running a workload may have different potential thermal effects. In various embodiments, a thermal effect of a workload may refer to any thermal change caused by running the workload, and a potential thermal effect may refer to a predicted thermal change caused by running the workload. The actual thermal effect of running a workload may depend on the resources that are allocated to run the workload, and on the thermal relationships between components that provide the allocated resources. For example, a workload that makes heavy use of processor and memory resources may cause overheating if processor and memory resources are allocated from a first CPU and a first DIMM for which a thermal relationship is significant (e.g., using the CPU has a significant thermal impact on the DIMM, or vice versa), but may be run without overheating if memory resources are allocated from a second DIMM that has a less significant thermal relationship to the first CPU (e.g., using the CPU does not significantly thermally affect the second DIMM). In general, determining potential thermal effects corresponding to different allocations of resources for running a workload may allow the apparatus 200 to select an allocation of resources for running the workload in a way that distributes or balances a thermal load among the components, or avoids exceeding a thermal limit for the components.

Because the actual thermal effect of running a workload may depend on the resources that are allocated to run the workload, the thermal effect module 204 may determine potential thermal effects for a variety of possible allocations of resources, from at least a portion of the components, to run the workload. Thus, one or more potential thermal effects may correspond to one or more possible allocations of resources, and may be determined by the thermal effect module 204 based on thermal relationships between components that provide the (possibly) allocated resources. For example, in one embodiment, the thermal effect module 204 may determine, specify, identify, receive, or generate several possible allocations of resources, where each possible allocation of resources indicates which components will provide resources to run the workload, and to what extent each component will provide resources. As a further example, one possible allocation of resources may indicate that the resources that would be allocated to run a workload include 50% of the processing resources of a certain CPU, 10% of the memory capacity of a certain DIMM, 30% of the storage bandwidth of a particular HDD, or the like. One of skill in the art will recognize many ways of specifying possible allocations of resources to run a workload.

In one embodiment, determining a potential thermal effect may include determining a primary thermal effect on a first set of components and a secondary thermal effect on a second set of components, where the primary thermal effect is based on the workload utilizing the first set of components, and the secondary thermal effect is based on heating of the second set of components by the first set of components. The secondary thermal effect may be based on thermal relationships determined by the thermal relationship module 202 between components in the first set and components in the second set. The first and second sets of components may overlap: a first component may experience both a primary thermal effect as it is heated by being utilized and a secondary thermal effect as it is heated by other utilized components that are in thermal relationships with the first component. For example, for a workload that makes heavy use of processor and memory, and a possible allocation of resources that includes 1 CPU and 1 DIMM, the thermal effect module 204 may determine a primary thermal effect that indicates how much the CPU would be heated by providing processing resources to run the workload, and how much the DIMM would be heated by providing memory resources to run the workload. The thermal effect module 204 may further determine a secondary thermal effect that indicates how much various other components (such as HDDs, other CPUs, other DIMMs, and the like) are heated by using the CPU and the DIMM, and that may also indicate how much the DIMM is heated by using the CPU, and how much the CPU is heated by using the DIMM. In various embodiments, determining primary and secondary thermal effects may allow the apparatus 200 to select an allocation of resources that accounts for the thermal relationships among components.

In one embodiment, determining one or more potential thermal effects may include predictively modeling a potential thermal effect over time. For example, in one embodiment, a workload may initially make heavy use of storage resources as data is retrieved, and subsequently make heavy use of processor and memory resources to process the data. The thermal effect module 204 may determine a potential thermal effect by modeling a thermal effect over time as a workload is run, noting peak impacts on different components at different times, temperature changes over time, or the like. In certain embodiments, predictively modeling potential thermal effects over time may allow the apparatus 200 to allocate resources based on potential thermal effects, over time, that allow multiple workloads to run simultaneously where the different workloads heat components at different times.

In various embodiments, the thermal effect module 204 may determine potential thermal effects at various levels of granularity. For example, in one embodiment, the thermal effect module 204 may simply determine whether or not overheating is likely to occur for different allocations of resources to run the workload. In another embodiment, the thermal effect module 204 may predict particular temperature increases that would be caused by running the workload with different allocations of resources. One of skill in the art will recognize many different ways of determining or specifying thermal effects at various levels of granularity.

In one embodiment, the thermal effect module 204 may determine potential thermal effects that depend on additional factors beyond possible resource allocations. For example, in one embodiment, a potential thermal effect may depend on an initial thermal state for the electronic device or its components, or on one or more additional workloads run by the electronic device. For example, a first workload may make heavy use of storage resources, and heavy utilization of a hard disk drive by the first workload may preheat various CPUs differently based on the thermal relationships between the hard disk drive and the CPUs, so that allocating one CPU to run a second workload may have a different potential thermal effect than allocating another CPU to run the second workload. In another embodiment, a workload may include a set of sub-workloads that may be run at different times or with different possible allocations of resources for each sub-workload, and the thermal effect module 204 may determine potential thermal effects that depend on when the sub-workloads would be run, and/or on what resources would be allocated to run the sub-workloads.

The apparatus 200, in one embodiment, includes a resource allocation module 206 that selects an allocation of resources from the one or more possible allocations of resources to run the workload, based on the potential thermal effects determined by the thermal effect module 204.

In various embodiments, the resource allocation module 206 may select an allocation of resources in different ways. For example, in one embodiment, the resource allocation module 206 may select an allocation of resources by actually allocating (or reallocating) the resources to run the workload. In another embodiment, the resource allocation module 206 may select an allocation of resources by recording or otherwise indicating what resources should be allocated when the workload is run. In a further embodiment, selecting an allocation of resources may include determining or indicating when the resources should be allocated and/or when the workload should be run.

In one embodiment, selecting an allocation of resources may include using a workload manager to allocate resources on a component by component basis. In various embodiments, allocating resources on a component by component basis may refer to allocating resources that are known to be provided by particular components. For example, a workload manager may generally allocate a particular amount of memory to run a workload, or may allocate memory on a component by component basis by indicating amounts of memory that will be provided for the workload by each DIMM.

In various embodiments, a workload manager may refer to any program, device, operating system component, hypervisor or the like, that controls the allocation of resources provided by electronic device components to run workloads. For example, in one embodiment, different workloads may be run in different processes or threads, and a workload manager may assign ranges of memory addresses, ranges of storage device logical block addresses, or the like, to the different threads or processes based on information available to the workload manager indicating which components provide particular address ranges. In another embodiment, different workloads may be run by different virtual machines running on the same physical server, and a hypervisor running on the physical server may allocate resources to each virtual machine on a component by component basis. In a further embodiment, the electronic device may be a computing cluster including multiple individual cluster nodes in thermal relationships, and a cluster controller may allocate nodes to run different workloads based on thermal effects. One of skill in the art will recognize many ways of using different types of workload managers to allocate resources on a component by component basis.

In various embodiments, the selected allocation of resources may be based on the determined potential thermal effects in various ways. For example, in one embodiment, the resource allocation module 206 may select an allocation of resources so that the determined thermal effects for the selected allocation avoid exceeding a thermal limit, such as a maximum temperature, a peak cooling capacity, or the like. In another embodiment the resource allocation module 206 may select an allocation of resources so that the determined thermal effects for the selected allocation balance or distribute a thermal load among the components (e.g., so that, on average, one component experiences approximately the same thermal effects, over time, as another similar component). One of skill in the art will recognize many ways of allocating resources, or selection resource allocations, based on potential thermal effects.

In one embodiment, where the thermal effect module 204 predictively models a potential thermal effect over time, the resource allocation module 206 may select an allocation of resources by allocating resources based on the potential thermal effect over time (e.g., to avoid exceeding a thermal limit at any point in time, or to distribute a thermal load). In certain embodiments, allocating resources based on a potential thermal effect over time may allow the apparatus 200 to provide balanced thermal results while running multiple workloads, due to peak thermal effects for different workloads occurring at different times.

Figure 3:
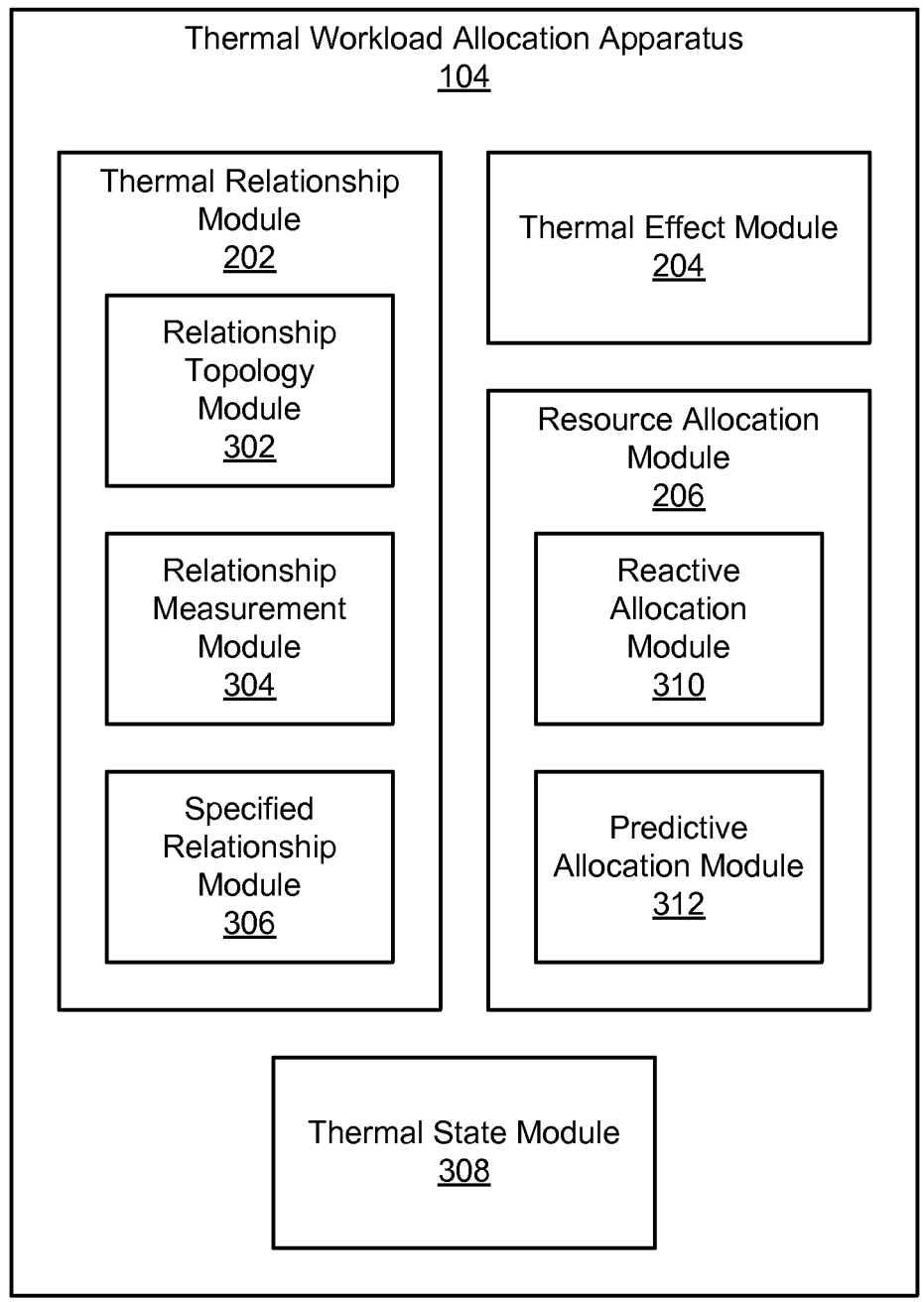
FIG. 3 is a schematic block diagram illustrating another embodiment of an apparatus for workload management.

FIG. 3 is a schematic block diagram illustrating another embodiment of an apparatus 300 for workload management. The apparatus 300 includes an embodiment of the thermal workload allocation apparatus 104 with a thermal relationship module 202, a thermal effect module 204, and a resource allocation module 206, which are substantially similar to those described above in relation to the apparatus 200 of FIG. 2. The thermal workload allocation apparatus 104, in various embodiments, may include a thermal state module 308, which is described below. The thermal relationship module 202, in various embodiments, may include a relationship topology module 302, a relationship measurement module 304, and a specified relationship module 306, which are described below. The resource allocation module 206, in various embodiments, may include a reactive allocation module 310 and a predictive allocation module 312, which are also described below.

The apparatus 300, in one embodiment, includes a thermal state module 308 that determines a thermal state of the electronic device using one or more temperature sensors. (In a certain embodiment, the apparatus 300 may include the electronic device, including components and temperature sensors.) A thermal state may include at least one temperature for at least one of the components. For example, in one embodiment, an electronic device may include CPU temperature sensors, DIMM temperature sensors, HDD temperature sensors, or the like. A temperature for a component may be measured by a temperature sensor included in the component, or by a nearby temperature sensor in the electronic device. Temperature measurements from the temperature sensors may be available to an operating system for the electronic device, a dedicated service processor for the electronic device, or the like, which may cooperate with the thermal state module 308 to determine the thermal state.

In a certain embodiment, the resource allocation module 206 may select the allocation of resources based on both the thermal state and the determined potential thermal effects. For example, in one embodiment, a thermal state may include a current temperature for a component that is near a maximum temperature for the component, and the potential thermal effects determined by the thermal effect module 204 may include different temperature increases for that component corresponding to different possible allocations of resources to run a workload. Accordingly, the resource allocation module 206 may select an allocation of resources with a temperature increase for the component that does not exceed the maximum temperature. In another embodiment, a thermal state may include a current temperature for a component (e.g., a CPU) that is below the current temperature for similar components (e.g., other CPUs), and the resource allocation module 206 may select an allocation of resources based on potential thermal effects that would equalize the temperature, or distribute the thermal load between similar components. One of skill in the art will recognize various ways of allocating resources based on determined potential thermal effects and a thermal state.

In one embodiment, the thermal relationship module 202 may determine the thermal relationships using a relationship topology module 302 that computes at least one of the thermal relationships based on a topology for the electronic device. In certain embodiments, a topology for an electronic device may include any information about the physical configuration of the electronic device. For example, in various embodiments, a topology for an electronic device may include information about the relative positions of components in the electronic device, the amount of space between components, the size of a case for the electronic device, the quantity and direction of airflow, or the like.

Various thermal relationships may be determined based on a device topology. For example, in one embodiment, the relationship topology module 302 may compute thermal relationships between components as a function of the distance between components. In another embodiment, the relationship topology module 302 may compute thermal relationships between components based on distance and airflow. One of skill in the art will recognize various ways of computing thermal relationships based on a topology for an electronic device.

In one embodiment, the thermal relationship module 202 may determine at least one of the thermal relationships using a relationship measurement module 304 that utilizes one component and measures the thermal impact on another component, using one or more temperature sensors. For example, in one embodiment, the relationship measurement module 304 may use one component at various power levels, and measure the temperature of another component at each power level. In another embodiment, the relationship measurement module 304 may utilize one component until it heats to a particular temperature, and measure a corresponding temperature for another component. One of skill in the art will recognize various ways of measuring thermal relationships.

In one embodiment, the thermal relationship module 202 may determine the thermal relationships using a specified relationship module 306 that receives at least one of the thermal relationships from an administrator for the electronic device, a storage location for specifications of the electronic device, and/or and a management entity for a plurality of electronic devices including the electronic device. For example, in one embodiment, an administrator may input a thermal relationship from a manufacturing specification for the electronic device into an interface for the specified relationship module 306. In another embodiment, specified thermal relationships may be stored on the electronic device (e.g., a dedicated service processor for the electronic device may have information about the thermal relationships), and the specified relationship module 306 may receive information about a thermal relationship from storage location on the electronic device. In a certain embodiment, the specified relationship module 306 may receive information about a thermal relationship from a data center infrastructure management system.

In one embodiment, the resource allocation module 206 may select an allocation of resources to run a workload by using a reactive allocation module 310 that reallocates resources while the workload is running. For example, in one embodiment, the apparatus 300 may initially run a workload using a default resource allocation, use the thermal effect module 204 to determine potential thermal effects for the default resource allocation and alternate resource allocations, and use the reactive allocation module 310 to reallocate resources based on the potential thermal effects, while the workload is running. In a certain embodiment, the reactive allocation module 310 may reallocate resources to avoid exceeding a thermal limit. In another embodiment, the reactive allocation module 310 may reallocate resources to improve the distribution of a thermal load.

In one embodiment, the resource allocation module 206 may select an allocation of resources to run a workload by using a predictive allocation module 312 that allocates resources for the workload before the workload runs. For example, in one embodiment, the apparatus 300 may use the thermal effect module 204 to determine potential thermal effects before the workload runs, and use the predictive allocation module 312 to select an acceptable allocation of resources prior to running the workload. In a certain embodiment, the predictive allocation module 312 may allocate resources to distribute a thermal load among the components. In another embodiment, the predictive allocation module 312 may allocate resources to avoid exceeding a thermal limit. In one embodiment, the predictive allocation module 312 may cooperate with the reactive allocation module 310, so that the predictive allocation module 312 selects an initial allocation of resources for running the workload, and the reactive allocation module 310 reallocates resources as necessary (e.g., in coordination with the resource needs and the thermal effects of other workloads).

Figure 4:
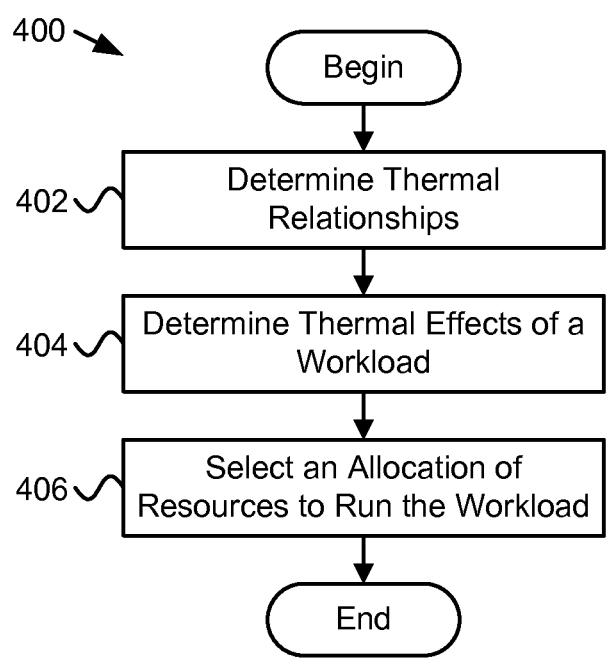
FIG. 4 is a schematic flow chart diagram illustrating one embodiment of a method for workload management.

FIG. 4 is a schematic flow chart diagram illustrating one embodiment of a method 400 for workload management. The method 400 begins and determines 402 a plurality of thermal relationships among components of an electronic device. For example, in one embodiment, the thermal relationship module 202 determines 402 a plurality of thermal relationships. The method 400 determines 404 one or more potential thermal effects of a workload on the components based on the thermal relationships. The one or more potential thermal effects correspond to one or more possible allocations of resources of at least a portion of the components to run the workload. For example, in one embodiment, the thermal effect module 204 determines 404 the potential thermal effects. The method 400 selects 406 an allocation of resources to run the workload, from the one or more possible allocations of resources to run the workload, based on the determined potential thermal effects, and the method 400 ends. For example, in one embodiment, the resource allocation module 206 selects 406 an allocation of resources to run the workload.

Figure 5:
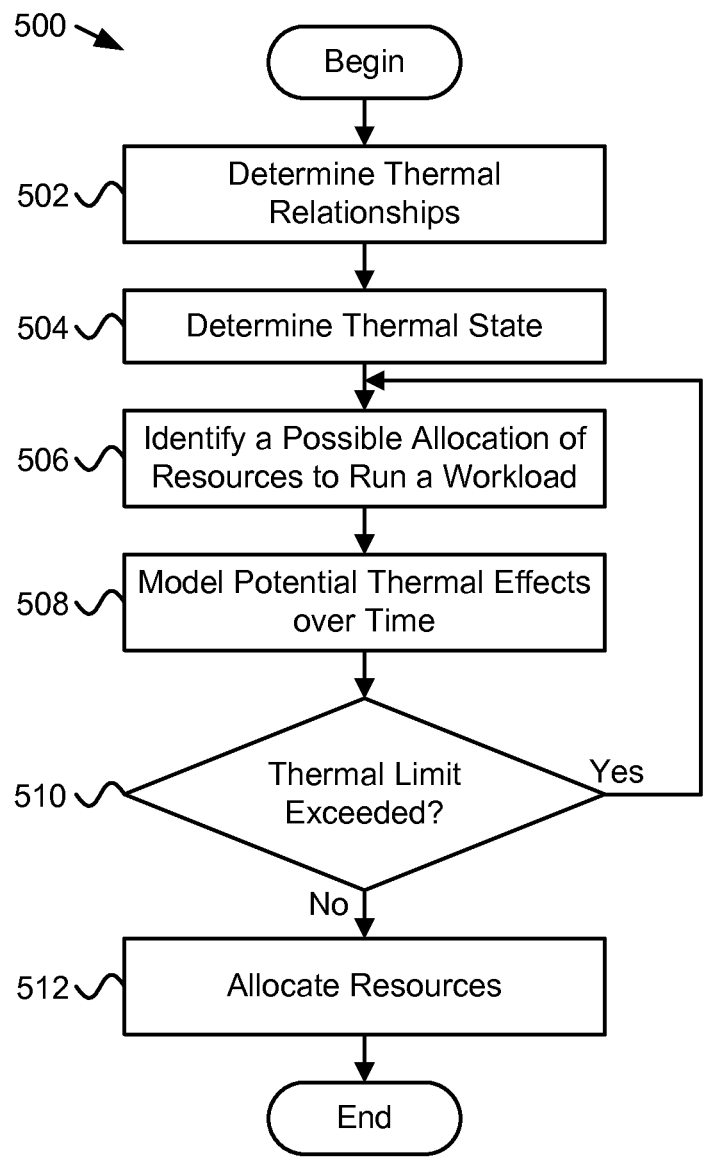
FIG. 5 is a schematic flow chart diagram illustrating another embodiment of a method for workload management.

FIG. 5 is a schematic flow chart diagram illustrating another embodiment of a method 500 for workload management. The method 500 begins and determines 502 a plurality of thermal relationships among components of an electronic device. For example, in one embodiment, the thermal relationship module 202 determines 502 a plurality of thermal relationships. The method 500 determines 504 a thermal state of the electronic device using one or more temperature sensors. For example, in one embodiment, a thermal state module 308 may determine 504 the thermal state. The method 500 identifies 506 a possible allocation of resources to run a workload, and models 508 the potential thermal effects, over time, corresponding to the identified allocation of resources.

In one embodiment, the thermal effect module 204 may identify 506 a possible allocation of resources and model 508 the potential thermal effects. The method 500 determines 510 whether the potential thermal effects would exceed a thermal limit. For example, in one embodiment, the thermal effect module 204 may determine 510 whether the thermal limit would be exceeded. If the thermal limit would be exceeded, the method 500 identifies 506 another possible allocation of resources to run the workload, and the method 500 continues. If the thermal limit would not be exceeded, the method 500 allocates 512 the resources to run the workload, according to the identified possible allocation of resources, and the method 500 ends. For example, in one embodiment, the resource allocation module 206 may allocate 512 the resources.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
a thermal relationship module that determines a plurality of thermal relationships among components of an electronic device by quantifying a thermal impact on one of the components of utilizing another of the components;
a thermal effect module that, for a plurality of possible allocations of resources of at least a portion of the components to run a workload, determines, using predictive modeling, a plurality of potential thermal effects of the workload on the components over time based on the thermal relationships by, determining a primary thermal effect on a first set of components based on the workload utilizing the first set of components and a secondary thermal effect on a second set of components based on heating of the second set of components by the first set of components; and
a resource allocation module that selects an allocation of resources from the plurality of possible allocations of resources to run the workload, based on the determined primary and secondary thermal effects, wherein selecting an allocation of resources comprises allocating the resources,
wherein said modules comprise one or more of hardware circuits, a programmable hardware device, and a processor executing code.

2. The apparatus of claim 1, further comprising a thermal state module that determines a thermal state of the electronic device using one or more temperature sensors, the thermal state comprising at least one temperature for at least one of the components, wherein the resource allocation module selects the allocation of resources based on the thermal state and the determined potential thermal effects, wherein the thermal state module comprises one or more of hardware circuits, a programmable hardware device, and a processor executing code.

3. The apparatus of claim 2, further comprising the electronic device, the electronic device comprising the components and the one or more temperature sensors.

4. The apparatus of claim 1, wherein the components comprise one or more of one or more processors, one or more memory modules, and one or more storage devices.

5. The apparatus of claim 1, wherein the plurality of thermal relationships comprises a network of thermal relationships between multiple components of the electronic device, wherein at least one of the components links two or more of the thermal relationships.

6. The apparatus of claim 1, wherein selecting an allocation of resources comprises reallocating resources while the workload is running, to avoid exceeding a thermal limit.

7. The apparatus of claim 1, wherein selecting an allocation of resources comprises allocating resources for the workload before the workload runs, to distribute a thermal load among the components.

8. The apparatus of claim 1, wherein determining the thermal relationships comprises computing a thermal relationship based on a topology for the electronic device.

9. The apparatus of claim 1, wherein determining the thermal relationships comprises utilizing one component and measuring the thermal impact on another component, using one or more temperature sensors.

10. The apparatus of claim 1, wherein selecting an allocation of resources comprises allocating resources, based on the potential thermal effect over time, to avoid exceeding a thermal limit.

11. The apparatus of claim 1, wherein selecting an allocation of resources comprises using a workload manager to allocate resources on a component by component basis, wherein the workload manager comprises one or more of hardware circuits, a programmable hardware device, and a processor executing code.

12. A method comprising:
   determining a plurality of thermal relationships among components of an electronic device by quantifying a thermal impact on one of the components of utilizing another of the components;
   determining, using predictive modeling for a plurality of possible allocations of resources of at least a portion of the components to run a workload, a plurality of potential thermal effects of the workload on the components over time based on the thermal relationships by determining a primary thermal effect on a first set of components based on the workload utilizing the first set of components, and determining a secondary thermal effect on a second set of components based on heating of the second set of components by the first set of components; and
   selecting an allocation of resources from the plurality of possible allocations of resources to run the workload, based on the determined primary and secondary thermal effects, wherein selecting an allocation of resources comprises allocating the resources.

13. The method of claim 12, wherein selecting an allocation of resources comprises reallocating resources while the workload is running, to avoid exceeding a thermal limit.

14. The method of claim 12, wherein selecting an allocation of resources comprises allocating resources for the workload before the workload runs, to distribute a thermal load among the components.

15. The method of claim 12, wherein determining the thermal relationships comprises utilizing one component and measuring the thermal impact on another component.

16. The method of claim 12, wherein determining the potential thermal effects comprises predictively modeling a potential thermal effect over time, and wherein selecting an allocation of resources comprises allocating resources, based on the potential thermal effect over time, to avoid exceeding a thermal limit.

17. A program product comprising a non-transitory computer readable storage medium that stores code executable by a processor, the executable code comprising code to perform:
   determining a plurality of thermal relationships among components of an electronic device by quantifying a thermal impact on one of the components of utilizing another of the components;
   determining, using predictive modeling for a plurality of possible allocations of resources of at least a portion of the components to run a workload, a plurality of potential thermal effects of the workload on the components over time based on the thermal relationships by determining a primary thermal effect on a first set of components based on the workload utilizing the first set of components, and determining a secondary thermal effect on a second set of components based on heating of the second set of components by the first set of components; and
   selecting an allocation of resources from the plurality of possible allocations of resources to run the workload, based on the determined primary and secondary thermal effects, wherein selecting an allocation of resources comprises allocating the resources.

* * * * *